United States Patent [19]

Ohta et al.

[11] Patent Number: 4,620,206

[45] Date of Patent: Oct. 28, 1986

[54] SEMICONDUCTOR DEVICE

[75] Inventors: Kimihiro Ohta, Kashiwa; Tadashi Nakagawa, Sakura; Naoyuki Kawai, Yatabe; Takeshi Kojima, Kashiwa; Mitsuo Kawashima, Toride, all of Japan

[73] Assignee: Agency of Industrial Science and Technology, Tokyo, Japan

[21] Appl. No.: 578,574

[22] Filed: Feb. 9, 1984

[30] Foreign Application Priority Data

Jul. 26, 1983 [JP] Japan ............................. 58-136171

[51] Int. Cl.$^4$ ............... H01L 27/12; H01L 29/161
[52] U.S. Cl. ................................... 357/4; 357/16
[58] Field of Search ......................... 357/4 SL, 16

[56] References Cited

U.S. PATENT DOCUMENTS

| | | | |
|---|---|---|---|
| 3,626,257 | 12/1971 | Esaki et al. ........................ | 317/234 |
| 3,626,328 | 12/1971 | Esaki et al. ........................ | 317/234 V |
| 3,893,148 | 7/1975 | Madjid ............................... | 357/4 X |
| 4,103,312 | 7/1978 | Chang ................................ | 357/16 |
| 4,205,329 | 5/1980 | Dingle ............................... | 357/4 X |
| 4,205,331 | 5/1980 | Esaki ................................. | 357/4 X |
| 4,250,515 | 2/1981 | Esaki ................................. | 357/16 |
| 4,503,447 | 3/1985 | Iafrate .............................. | 357/4 X |

Primary Examiner—Martin H. Edlow
Attorney, Agent, or Firm—Spencer & Frank

[57] ABSTRACT

A semiconductor device comprises a superlattice semiconductor portion having a plurality of pairs of superlattice semiconductor thin films for forming step differences of band edge energy. The pairs of the thin films are laminated such that parameters which determine the structure of the thin films are monotonically changed in the direction of the lamination of the thin films. Electrodes are disposed to apply an electric field across both ends of the superlattice semiconductor portion. The semiconductor device has a good negative resistance characteristic and a large design freedom of semiconductor device.

26 Claims, 40 Drawing Figures

FIG_3A
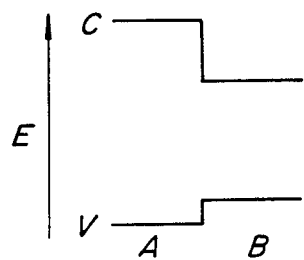
FIG_3B
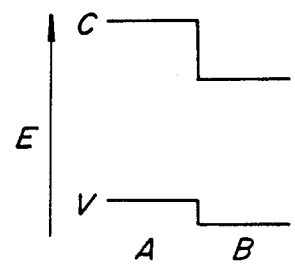
FIG_3C
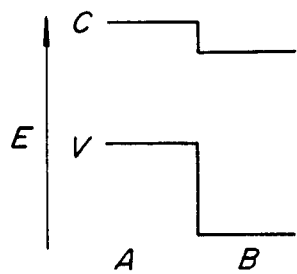
FIG_3D
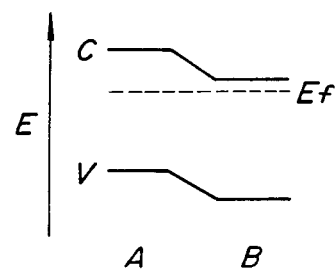
FIG_3E
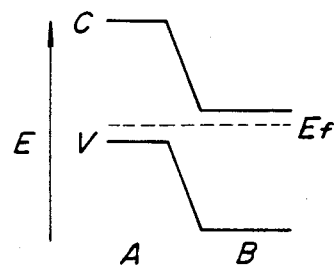

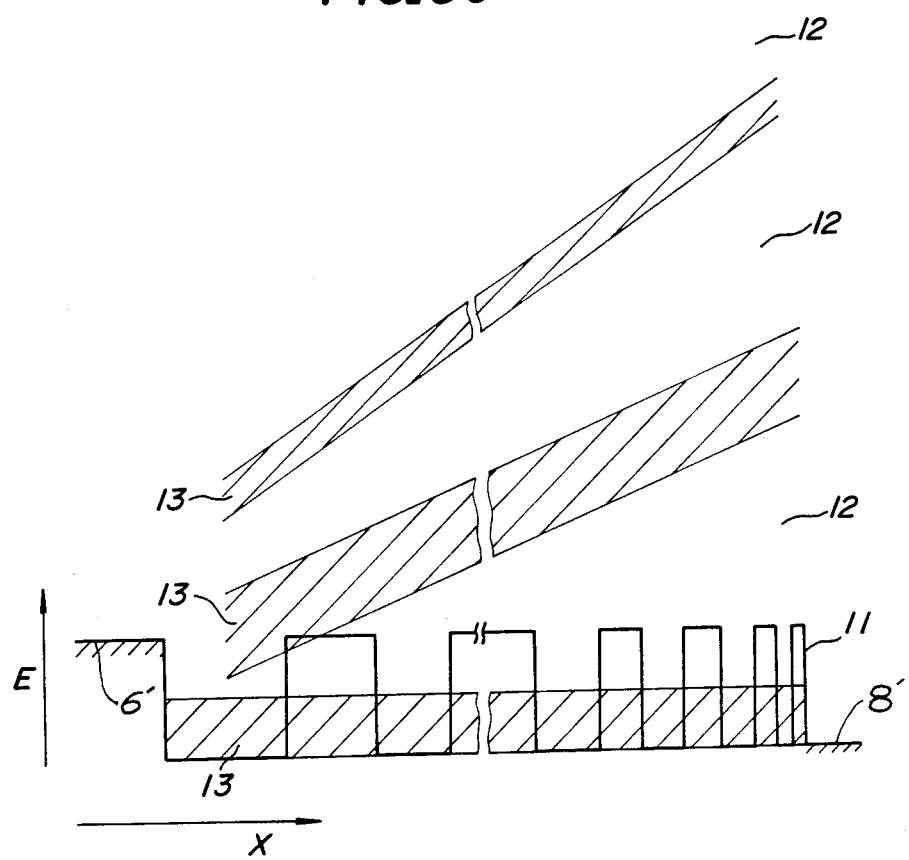

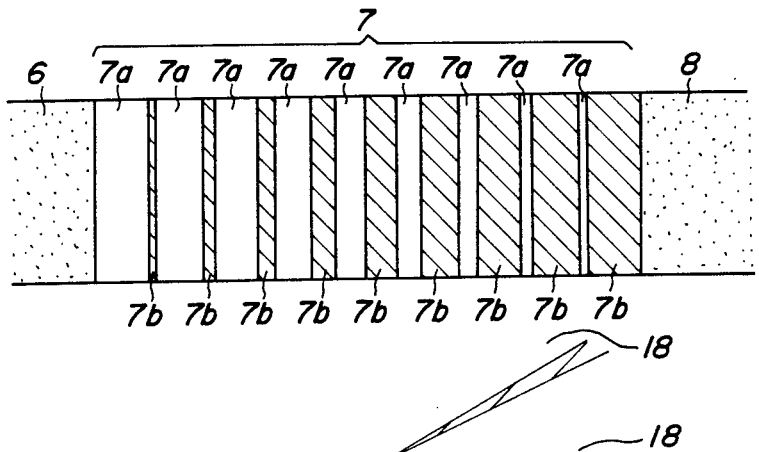
FIG_7A
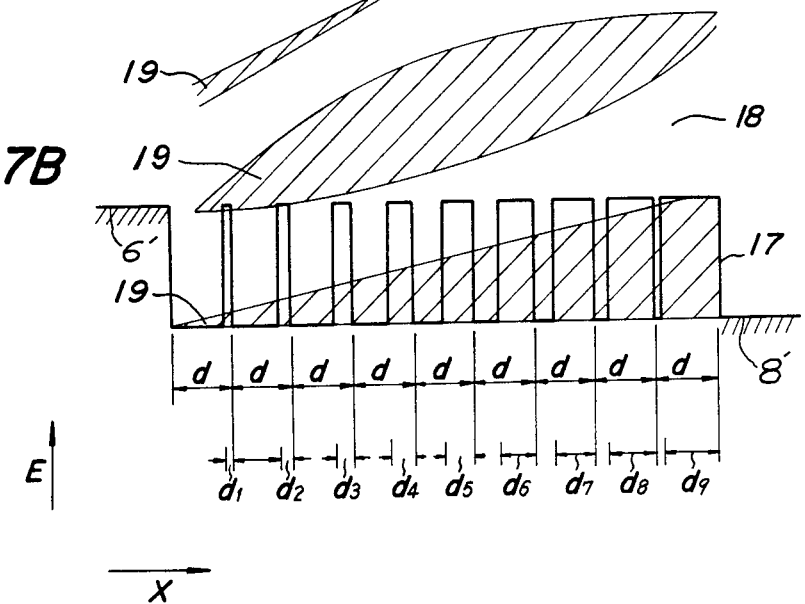
FIG_7B

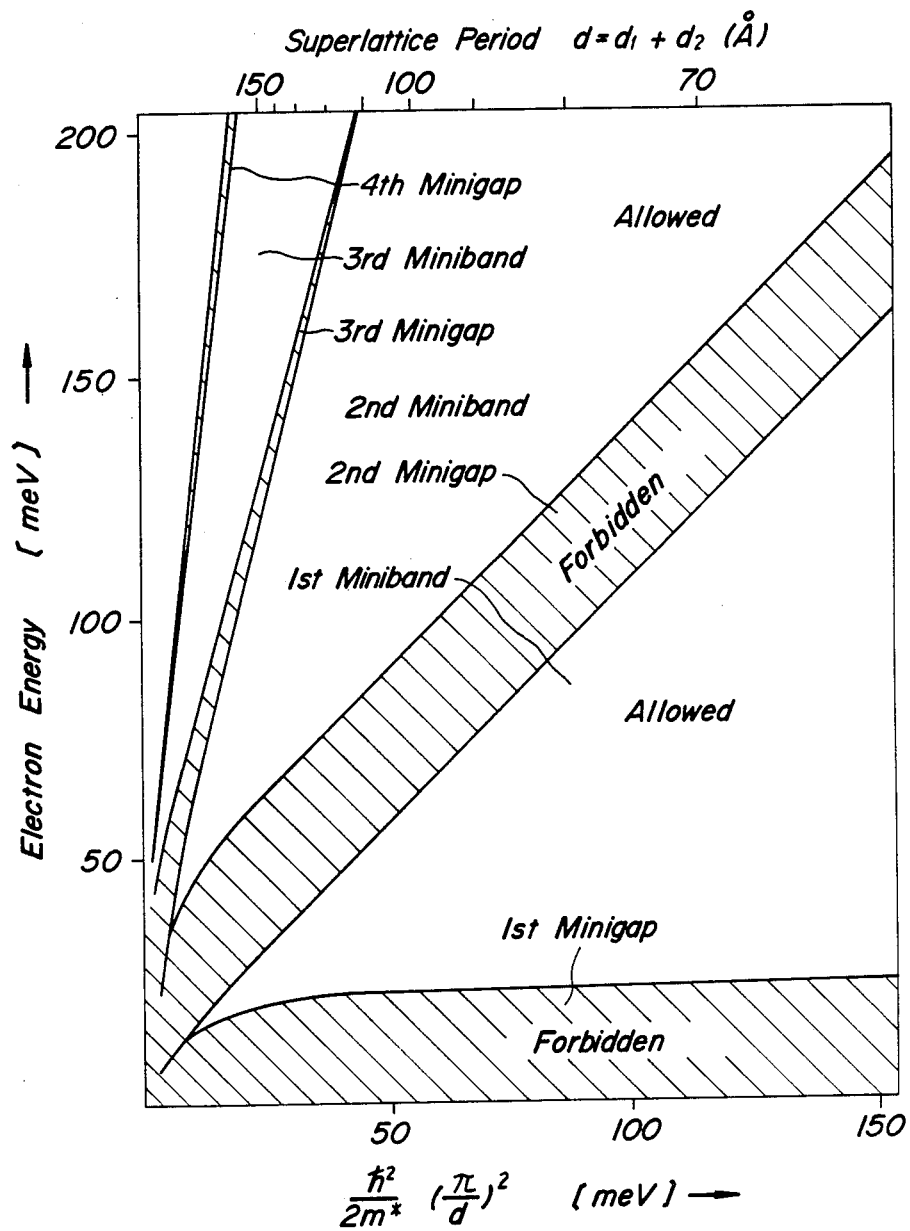

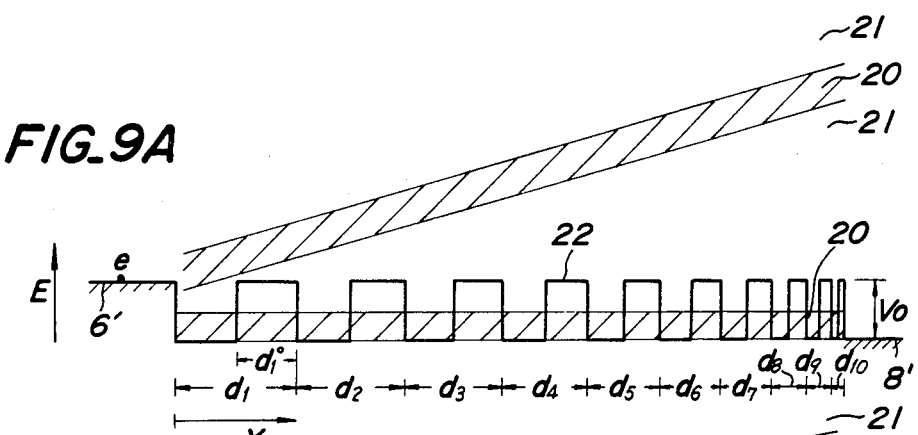
FIG._9A
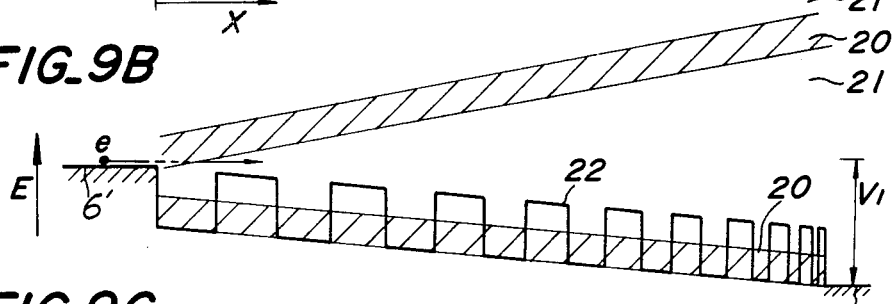
FIG._9B
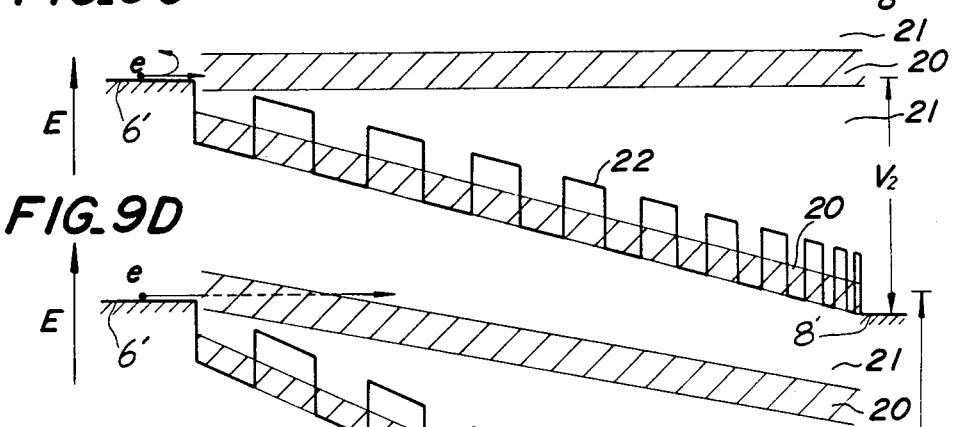
FIG._9C
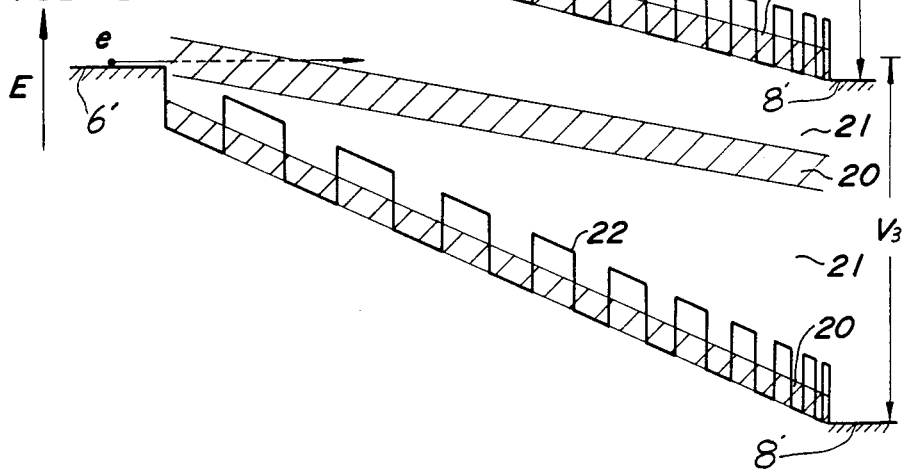
FIG._9D

FIG_10
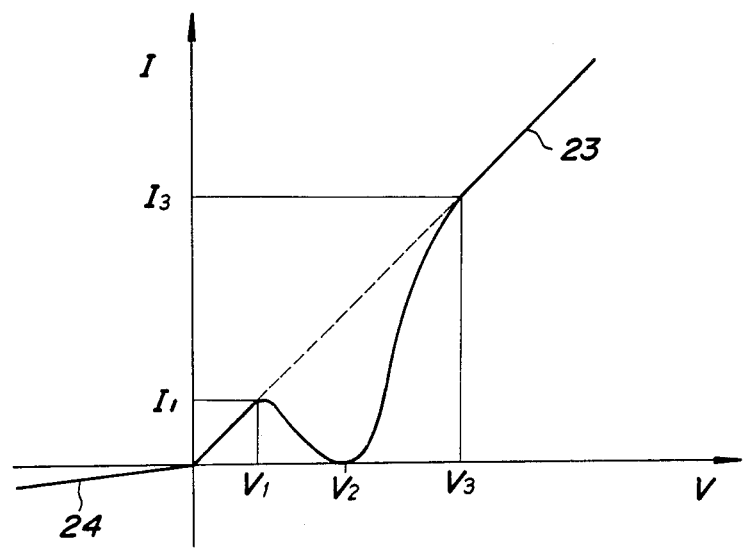
FIG_11
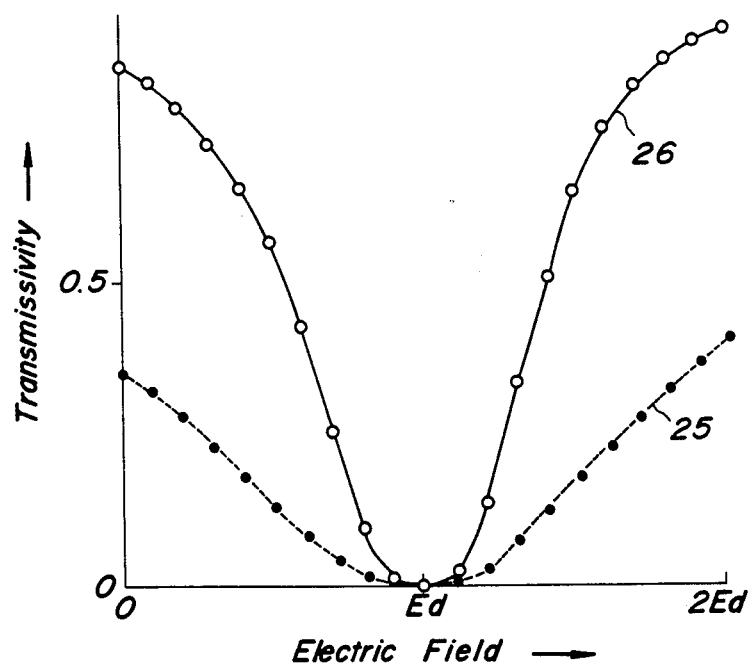

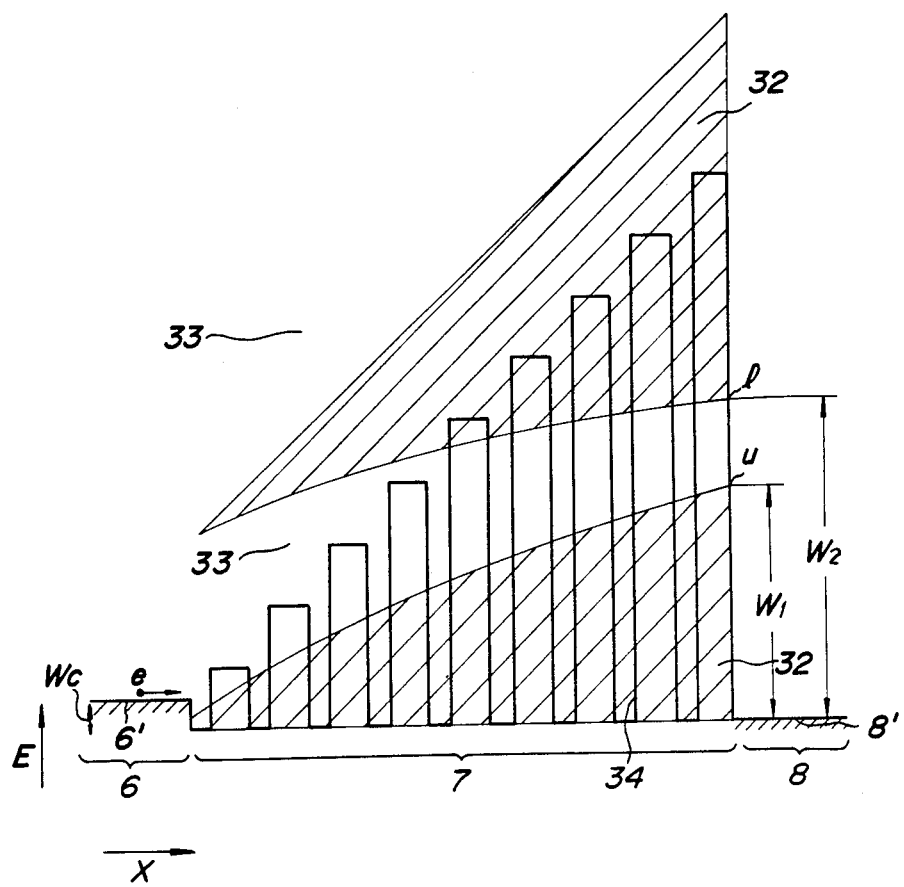
FIG_14

FIG_15A
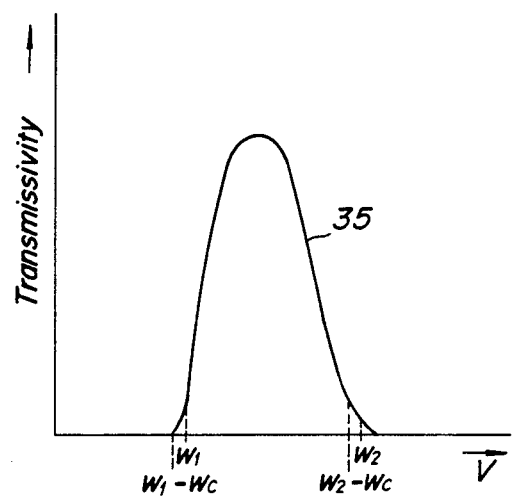
FIG_15B
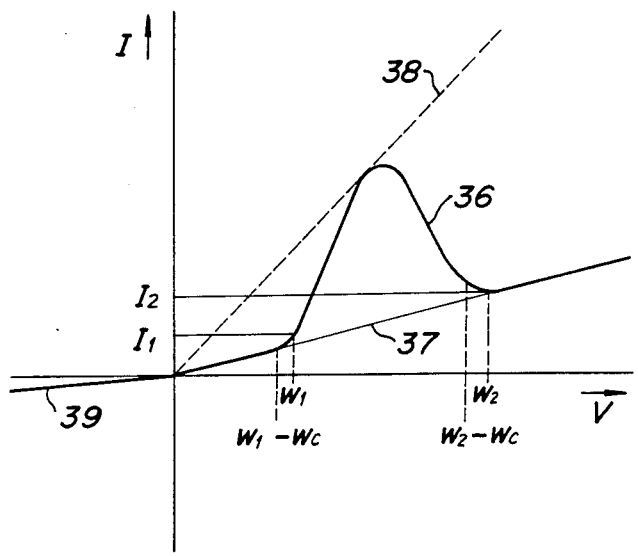

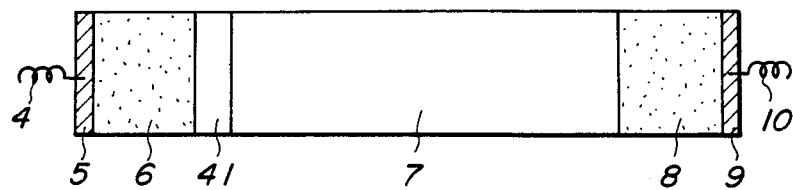
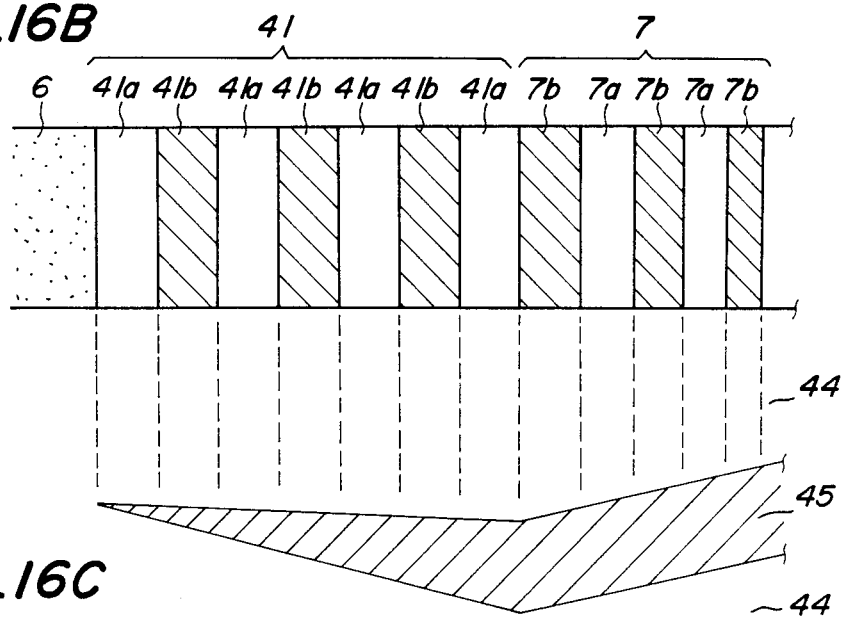
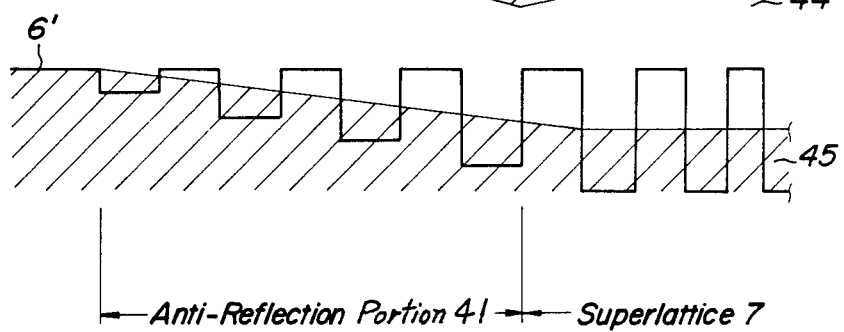

FIG_17A
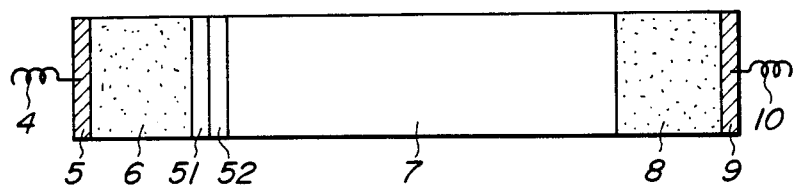
FIG_17B
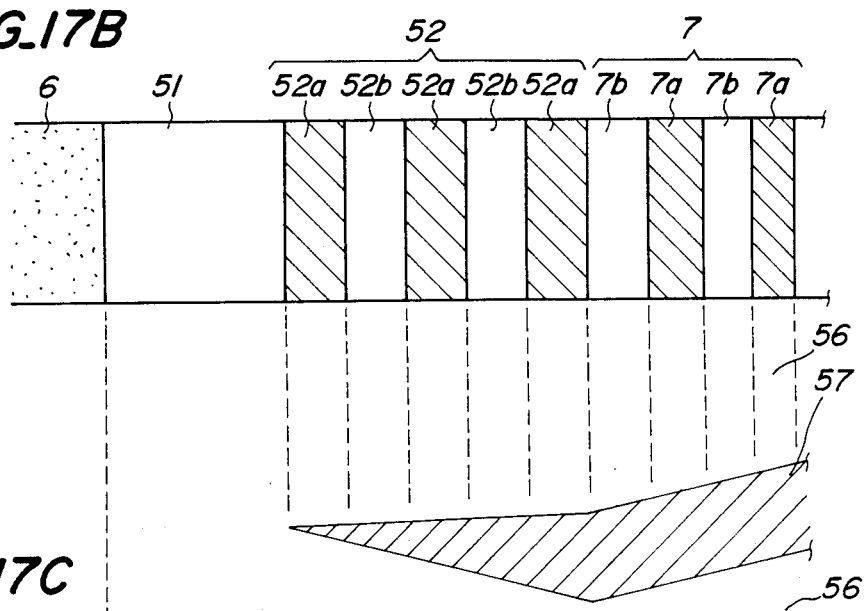
FIG_17C
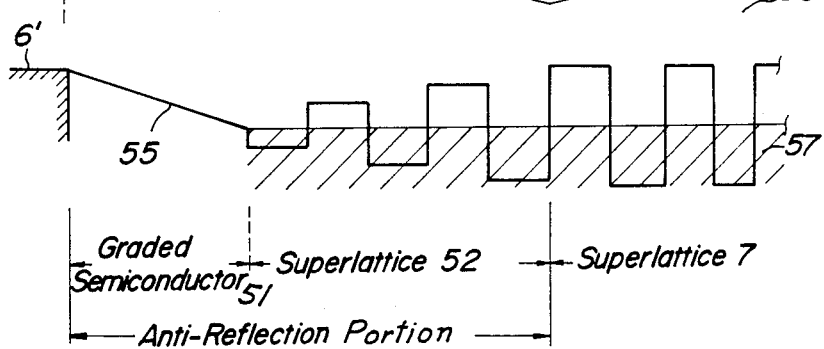

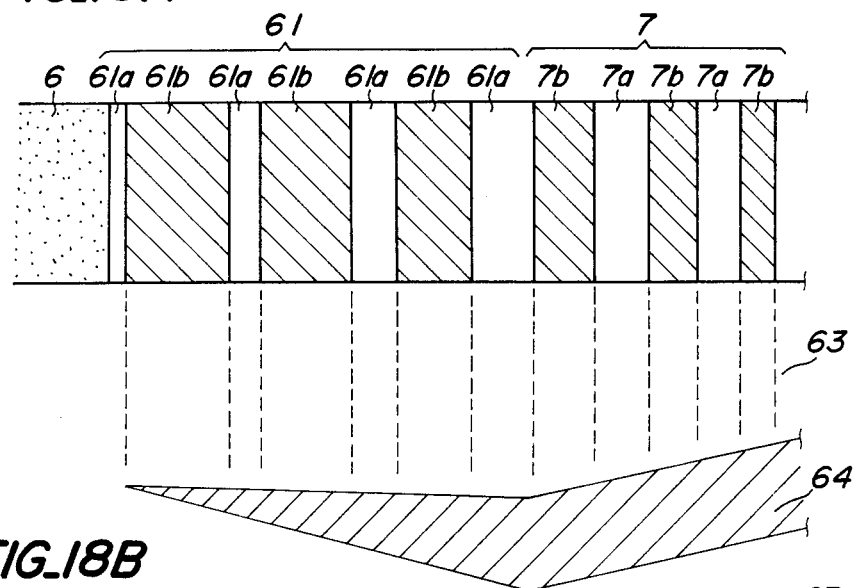
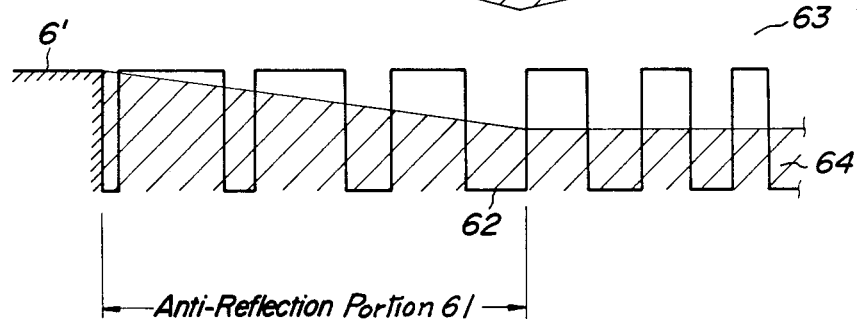

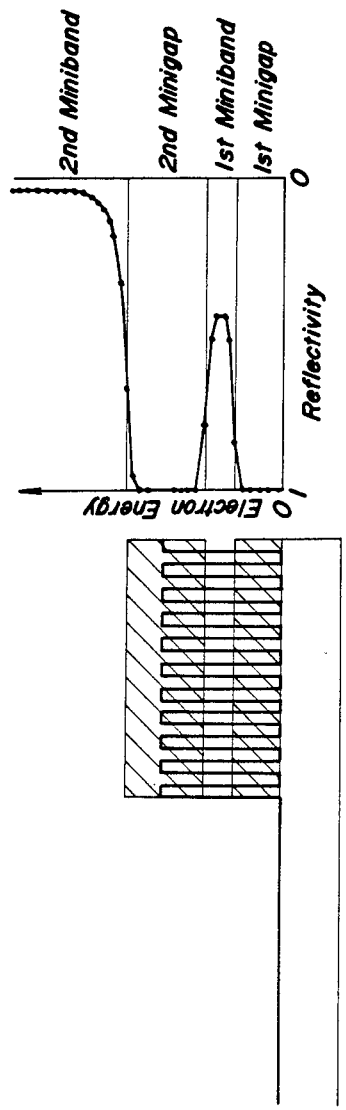
FIG_21A
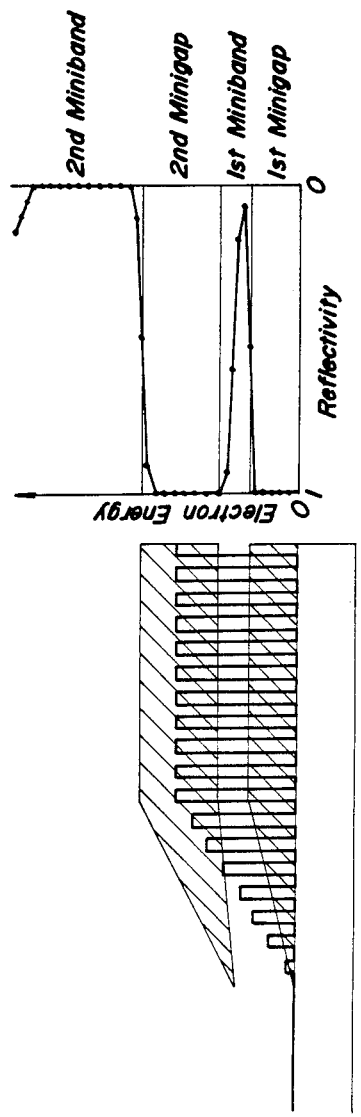
FIG_21B

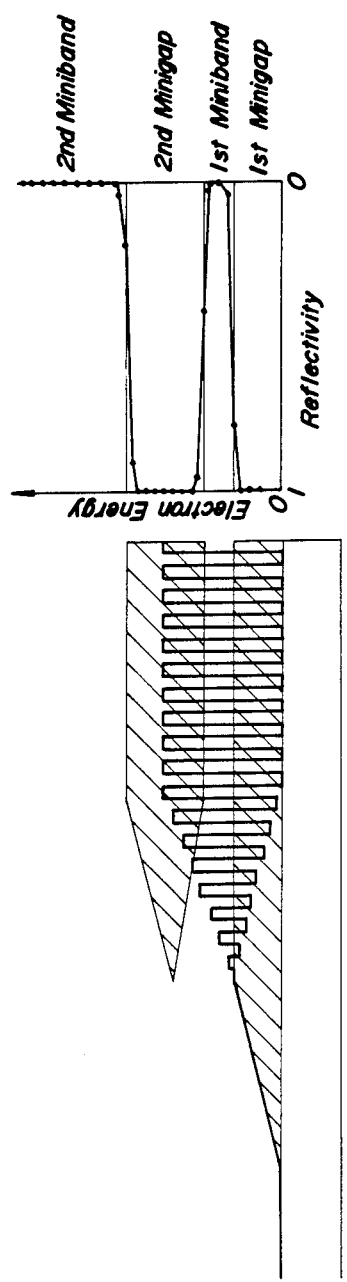
FIG._21C

SEMICONDUCTOR DEVICE

BACKGROUND OF THE INVENTION

1. Field of the Invention

The present invention relates to a semiconductor device having a differential negative resistance in response to an electric field applied thereto.

2. Description of the Prior Art

A semiconductor device exhibiting a differential negative resistance (referred to as negative resistance) is used in a variety of circuits, for example, switching circuits, oscillation circuits, amplifier circuits, detector circuits, frequency mixer circuits or the like. It has been desired that such a semiconductor device can flexibly be designed according to any specification of a circuit to which the semiconductor device is applied.

Various types of negative resistance devices have been produced. Some notable devices of this type recently proposed are Gunn effect devices, tunnel diodes, perfectly periodic superlattice structure devices, or the like.

The Gunn effect device is made of direct-gap compound semiconductor such as GaAs or InP. In this device, the Gunn effect is determined solely by the energy band structure of the material, so that it is difficult to modify any characteristic of the Gunn effect artificially. Therefore, the Gunn effect limits the designable range for an electric field providing negative resistance, a current density, a size of the Gunn effect device, an electron density, and so on. For this reason, it is very difficult to flexibly design the Gunn effect device in accordance with any specifications of an electric circuit to which the Gunn effect device is applied.

A tunnel diode utilizes the tunnel phenomonon of electrons through the p-n junction to which impurities of high concentration are doped. Therefore, the negative resistance characteristic is determined solely by the energy band structure of the semiconductor to be used. This feature extremely restricts a design freedom of the tunnel diode and thus it is difficult to design the tunnel diode in accordance with any specifications of an electric circuit to which the tunnel diode is applied.

A semiconductor device with a perfectly periodic superlattice structure is disclosed in U.S. Pat. Nos. 3,626,328 and 3,626,257 by L. Esaki et al.

Such a superlattice structure will be given with reference to FIGS. 1 and 2. FIG. 1 schematically illustrates a potential 1 formed dependent on the band edge energy for electrons produced by the perfectly periodic superlattice structure (referred to merely as superlattice hereinafter), the allowed bands 2 in the superlattice based on the potential 1 (referred to as a miniband), and forbidden gaps 3 in the superlattice (referred to as minigaps). In FIG. 1, the abscissa represents a distance x and the ordinate represents an energy E for electrons.

Further, the minibands 2 and the minigaps 3 formed in connection with the potential 1 shown in FIG. 1 are schematically illustrated. In the figure, the period of the potential 1 is designated by d, and the height or amplitude of the potential 1 by $V_0$. Further, the minigaps 3 and the minibands 2, as illustrated, are only the first to third ones from the bottom, for the simplicity of illustration. When an electric field is applied to the superlattice, the potential 1, the minigaps 3, and the minibands 2 in FIG. 1 are varied as shown in FIG. 2.

In FIG. 2, the potential 1, the minibands 2, and the minigaps 3 are tilted down in the X direction due to the application of the electric field. The electron e at the bottom edge of the first miniband 2, or at point P1, moves back and forth between points P1 and P2 of the first miniband 2. In order that this oscillating motion causes the negative resistance in the superlattice, all of the electrons in the superlattice must repeat the oscillation motions simultaneously, in the same direction, and in a synchronizing manner. For this purpose, it is necessary to minimize the scattering by the lattice vibrations and the doped impurities. Further, the potential 1 must be designed so as to reduce the number of electrons which tunnels through, for instance, the second minigap 3 to reach point P3 in FIG. 2. In order to obtain the negative resistance in the superlattice in this manner, some measure must be taken to minimize such scattering and tunnelling of electrons. This makes the device design remarkably difficult.

In the case of injecting electrons into the superlattice, it can not always be assured that such electrons efficiently enter the superlattice to completely penetrate through the superlattice, even if it is possible that electrons with certain energy can be present in the superlattice. Actually, according to the simulation conducted by the inventors, the perfect reflection of electrons was easily realized, whereas the penetration of electrons therethrough is low in efficiency.

SUMMARY OF THE INVENTION

With the above in view, it is an object of the present invention to provide a semiconductor device which has a large design freedom in accordance with specifications of electric circuit design to which the semiconductor device is applied, little restriction in manufacturing, and a good negative resistance characteristic, and is insensitive to various types of scatterings of electrons.

It is another object of the present invention to provide a semiconductor device with a negative resistance characteristic, which is flexibly applicable for various type of electric circuits such as switching circuits, amplifying circuits, oscillation circuits, detection circuits, and frequency mixing circuits.

It is yet another object of the present invention to provide a semiconductor device with a modified superlattice structure in which with application of electric field to the superlattice structure, the miniband is tilted in the superlattice stacking direction.

It is a further object of the invention to provide a semiconductor device in which the superlattice is laminated with an anti-reflection layer which is anti-reflective for electrons from a view point of quantum phenomenon, to enable electrons injected into the CHIRP superlattice to efficiently penetrate through the CHIRP superlattice.

In order to achieve the above objects, a semiconductor device according to the present invention comprises a CHIRP superlattice semiconductor portion having a plurality of pairs of CHIRP superlattice semiconductor thin films for forming step differences of band edge energy, of which the pairs of the thin films are laminated such that parameters which determine the structure of the thin films are monotonically changed in the direction of the lamination of the thin films; and electrodes are disposed to apply an electric field across both ends of the CHIRP superlattice semiconductor portion.

This type of modulated CHIRP superlattice will be referred to as "CHIRP" (coherent hetero interfaces for reflection and penetration) superlattice, hereinafter.

Here, the minibands of the CHIRP superlattice semiconductor thin films may be changed.

It is preferable that the thickness of each pair of the CHIRP superlattice semiconductor thin films is changed in the lamination direction. Thickness ratios of the thin films in the respective pairs can be varied.

It is preferable that a band edge energy of one of the thin films in each pair is changed with respect to that of the other.

It is also preferable that thickness ratios of the thin films in the respective pairs are varied.

A homogeneous semiconductor layer may be disposed between the semiconductor portion and at least one of the electrodes. Here, a low carrier concentration semiconductor layer may be disposed between the homogeneous semiconductor layer and the CHIRP superlattice semiconductor portion. An anti-reflection portion can be disposed adjacent to the CHIRP superlattice semiconductor portion, and the homogeneous semiconductor layer can be disposed between the anti-reflection portion and one of the electrodes. The anti-reflection portion may include a semiconductor portion which is disposed adjacent to the homogeneous semiconductor layer, and the composition of which changes continuously. Here, the composition of the semiconductor portion can gradually change in a graded manner. The anti-reflection portion may be disposed between the homogeneous semiconductor layer and one of the electrodes.

According to another aspect of the present invention, a semiconductor device comprises a CHIRP superlattice semiconductor portion having a plurality of pairs of CHIRP superlattice semiconductor thin films for forming step differences of band edge energy, of which the pairs of the thin films are laminated such that parameters which determine the structure of the thin films are monotonically changed in the direction of the lamination of the thin films; electrodes disposed to apply an electric field across both ends of the CHIRP superlattice semiconductor portion; and an anti-reflection portion which is disposed between the CHIRP superlattice semiconductor portion and at least one of the electrodes, and which has a structure which gradually changes to correspond substantially to the structure of the CHIRP superlattice semiconductor portion in the vicinity of the CHIRP superlattice semiconductor portion.

The anti-reflection portion may be formed by a CHIRP superlattice semiconductor having a plurality of pairs of CHIRP superlattice semiconductor thin films for forming step differences of band edge energy. Here, the pairs of the thin films can be laminated such that parameters which determine the structure of the thin films are monotonically changed in the direction of the lamination of the thin films and the thicknesses of the thin films in each of the plurality of pairs can substantially be equal to one another in the lamination direction. A band edge energy of one of the thin films in each pair can be changed with respect to that of the other. The CHIRP superlattice may be formed by a pair of different semiconductor thin films.

The anti-reflection portion may be formed by a CHIRP superlattice semiconductor having a plurality of pairs of CHIRP superlattice semiconductor thin films for forming step differences of band edge energy. The pairs of the thin films can be laminated such that parameters which determine the structure of the thin films are monotonically changed in the direction of the lamination of the thin films. The thickness of each pair of the CHIRP superlattice semiconductor thin films can be changed in the lamination direction.

The anti-reflection portion may be formed by a CHIRP superlattice semiconductor having a plurality of pairs of CHIRP superlattice semiconductor thin films for forming step differences of band edge energy. The pairs of the thin films can be laminated such that parameters which determine the structure of the thin films are monotonically changed in the direction of the lamination of the thin films, the thicknesses of the thin films in each of the plurality of pairs can substantially be equal to one another in the lamination direction. A band edge energy of one of the thin films in each pair can be changed with respect to that of the other. Thickness ratios of the thin films in the respective pairs can be varied with respect to each other.

Other objects and features of the invention will be apparent from the following description taken in conjunction with the accompanying drawings, in which:

BRIEF DESCRIPTION OF THE DRAWINGS

FIGS. 3A–3E schematically illustrate the step difference of the band edge energy;

FIG. 5C is an energy diagram illustrating minibands and minigaps formed by the potential of the CHIRP superlattice structure;

FIG. 7A is an enlarged schematic diagram showing an embodiment of a semiconductor device according to the present invention having a CHIRP superlattice structure with a modulated ratio of film thicknesses;

FIG. 7B is a potential and energy diagram illustrating a potential, minibands and minigaps formed by the structure shown in FIG. 7A;

FIG. 8 is a graph illustrating dependence of minibands and minigaps on the periodicity in a superlattice made of periodically alternating thin layers of two different semiconductors, the results being obtained by computer calculation;

FIGS. 9A–9D illustrate potentials, minibands and minigaps in the semiconductor device with a CHIRP superlattice structure when a voltage is applied to the CHIRP superlattice structure;

FIG. 10 illustrates a current-voltage characteristic of the CHIRP superlattice structure;

FIG. 11 is a diagram illustrating computer simulation results of the relationship between the transmissivity of electrons passing through the CHIRP superlattice structure and an electric field applied thereto;

FIG. 14 is a potential and energy diagram illustrating a modification of the potential formed by the CHIRP superlattice structure;

FIGS. 15A and 15B are graphical representations of a relationship of electron transmissivity vs. voltage as given by the minibands and minigaps in FIG. 14, and a relationship of current vs. voltage;

FIG. 16A is a schematic diagram showing another embodiment of a semiconductor device with an anti-reflection region according to the present invention;

FIG. 16B is an enlarged schematic diagram showing a detailed structure of the anti-reflection region and the superlattice in FIG. 16A;

FIG. 16C is a potential and energy diagram illustrating a potential, minibands and minigaps formed by the structure shown in FIG. 16A;

FIG. 17A is a schematic diagram of a modification of the semiconductor device shown in FIG. 16A in which a graded semiconductor and a superlattice are used for the anti-reflection portion;

FIG. 17B is an enlarged schematic diagram showing a detailed structure of an anti-reflection portion composed of the graded semiconductor and the CHIRP superlattice;

FIG. 17C is a potential and energy diagram illustrating a potential, minibands and minigaps formed by the structure shown in FIG. 17A;

FIG. 18A is an enlarged schematic diagram showing a structure of a modification of the semiconductor device shown in FIG. 16A in which the CHIRP superlattice forms an anti-reflection portion;

FIG. 18B is a potential and energy diagram illustrating a potential, minibands and minigaps of the semiconductor device shown in FIG. 16A;

FIGS. 21A-21C illustrate, each, the combination of a potential and energy diagram and electron reflectivity in the superlattice, obtained by computer simulation.

DETAILED DESCRIPTION OF THE PREFERRED EMBODIMENTS

Figure 1:
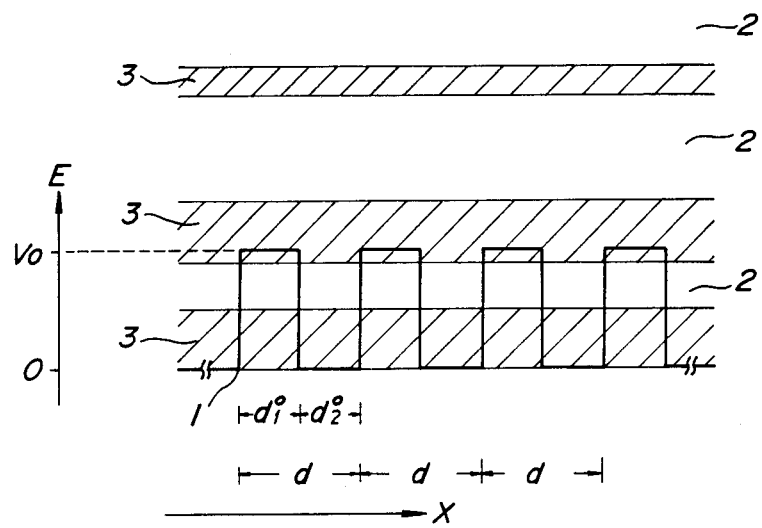
FIG. 1 is a potential diagram illustrating potentials of a conventional superlattice structure.
Figure 2:
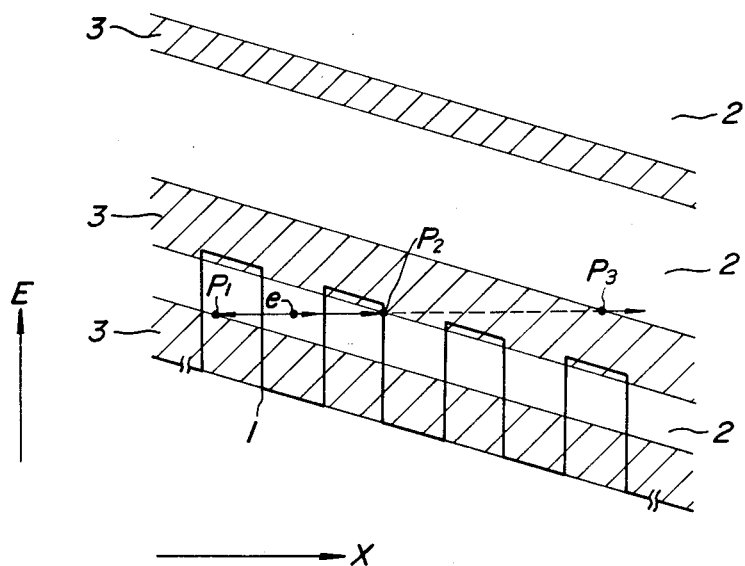
FIG. 2 is a potential diagram illustrating potentials of the superlattice structure when an electric field is applied to the superlattice structure.

First, explanation will be made of the formation of the potential 1 as shown in FIG. 1 with referring to FIGS. 3A-3E.

FIGS. 3A-3C illustrate step differences of band edge energy formed by the hetero-junction obtained by a combination of two kinds of semiconductors A and B selected from various types of semiconductors, and FIGS. 3D and 3E illustrate step differences of band edge energy formed by impurity doping. In the figures, C designates the lower edge of a conduction band, V the upper edge of a valance electron band, and $E_f$ Fermi's energy. A combination of semiconductors A and B which is classified as the type shown in FIG. 3A may be obtained by combining the following semiconductors:

$Al_xGa_{1-x}As$—GaAs, AlAs—GaAs, Si—Ge, $AlSb$—GaSb, $Al_xGa_{1-x}Sb$—GaSb, AlAs—Ge, $Al_xGa_{1-x}As$—Ge, $Al_xGa_{1-x}As$—$Al_yGa_{1-y}As$ ($x>y$), GaAs—InAs, $In_xGa_{1-x}As$—InAs, $In_xGa_{1-x}As$—$In_yGa_{1-y}As$ ($x>y$), InP—InAs, $InP_xAs_{1-x}$—$InP_yAs_{1-y}$ ($x>y$), CdTe—InSb, $Cd_xHg_{1-x}Te$—InSb, $Al_xIn_{1-x}Sb$—$Al_yIn_{1-y}Sb$ ($x>y$), $In_xGa_{1-x}As_yP_{1-y}$—$In_zGa_{1-z}As_uP_{1-u}$ ($x<z$, $y<u$).

A combination of semiconductors A and B which is classified as the type shown in FIG. 3B may be obtained by combining the semiconductors:

GaSb—InSb, $In_xGa_{1-x}Sb$—InSb, $In_xGa_{1-x}Sb$—$In_yGa_{1-y}Sb$ ($x<y$), Si—InAs, Si—$In_xGa_{1-x}As$, GaSb—InAs, AlSb—InPs, AlSb—CdTe, AlAs—CdTe. The following semiconductors may be combined as a combination of semiconductors A and B for providing the step difference of band edge energy of FIG. 3C:

Ge—GaAs, InAs—AlSb, $In_xAl_{1-x}As$—AlSb, InSb—InAs, GaSb—InAs, GaAs—InP, Si—GaP, Si—ZnSe, Si—CdTe.

In FIGS. 3D and 3E, the combinations of two conductivity characteristics are used. The combination of semiconductors A and B in FIG. 3D corresponds to the n-n$^+$ type semiconductors, and that of FIG. 3E corresponds to the p-n type semiconductors.

The semiconductors A and B may be monocrystalline semiconductor or amorphous semiconductor.

Also in FIGS. 3A-3C, each semiconductor may be of n or p conductivity type.

Accordingly, a number of further methods are available for the formation of step differences of band edge energy. The superlattice may be formed by suitably combining the semiconductors selected from the above-described groups, so that the potential 1 is formed as shown in FIG. 1 by the step difference of band edge energy. In the conduction band, the step difference of band edge energy provides the potential 1 for electrons. In the valence electron band, the step difference of band edge energy provides the potential 1 for holes. Therefore, the discussion on the potential 1 for electrons is correspondingly applicable to the potential 1 for holes, if n conductivity type is replaced by p conductivity type, and E by —E. In the following explanation, only the potential 1 for electrons will be referred to for ease of explanation.

Figure 4:
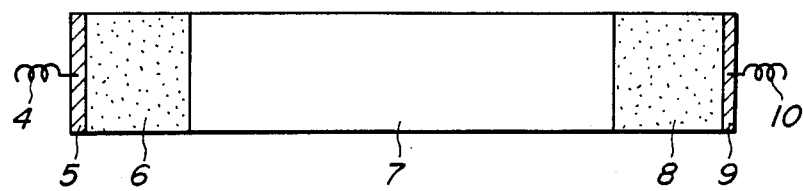
FIG. 4 is a schematic diagram showing an embodiment of a semiconductor device according to the present invention.

Reference is made to FIG. 4 showing an embodiment of a semiconductor device according to the present invention. In the figure, reference numerals 4 and 10 designate lead wires, 5 and 9 electrodes, 6 and 8 n-type homogeneous semiconductors, and 7 a semiconductor with a CHIRP (coherent heterointerfaces for reflection and penetration) superlattice structure.

Figure 5A:
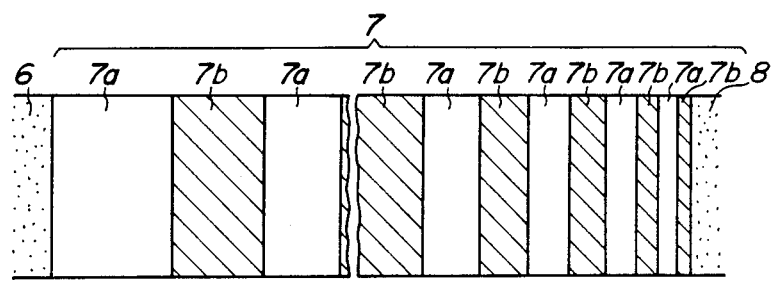
FIG. 5A is an enlarged schematic diagram showing an embodiment of a semiconductor device according to the present invention having a CHIRP superlattice structure with gradually changing periodicity.

An enlarged structure of the portion of the semiconductor 7 shown in FIG. 4 is shown in detail in FIG. 5A. In FIG. 5A, thin layers of two different semiconductors 7a and 7b are alternately multilayered by combining semiconductors capable of forming the step differences of the band edge energy shown in FIGS. 3A-3E. The multilayered semiconductor thin layers 7a and 7b may be formed by an epitaxial growth method such as the molecular beam epitaxy method and the organometallic chemical vapor deposition method (MOCVD method). The thickness of pairs of the semiconductor thin layers 7a and 7b may be modulated with gradually changing periodicity in a manner such that the thickness is gradually reduced from the n-type homogeneous semiconductor 6 to the n-type homogeneous semiconductor 8. The modulated period of the superlattice are denoted as $d_1, d_2, \ldots, d_i, \ldots, d_n$ with suffixes in FIG. 5B. The thickness ratio of the pair of the semiconductor thin layers 7a and 7b in one superlattice period may be set to be equal to each other.

The n-type homogeneous semiconductor 6 may be selected so that its potential 6' has the same level as that of the potential formed by the semiconductor layer 7b. It is not always necessary that the potential 6' formed by the semiconductor 6 is made equal in level to that formed by the semiconductor layer 7b. The n-type semiconductor 6 may be selected according to a negative resistance characteristic as required and an electric circuit to which the semiconductor device is applied.

The n-type homogeneous semiconductor 8 may be selected so that the potential 8' formed by the semiconductor 8 has the same level as that of the potential formed by the semiconductor layer 7a.

Figure 5B:
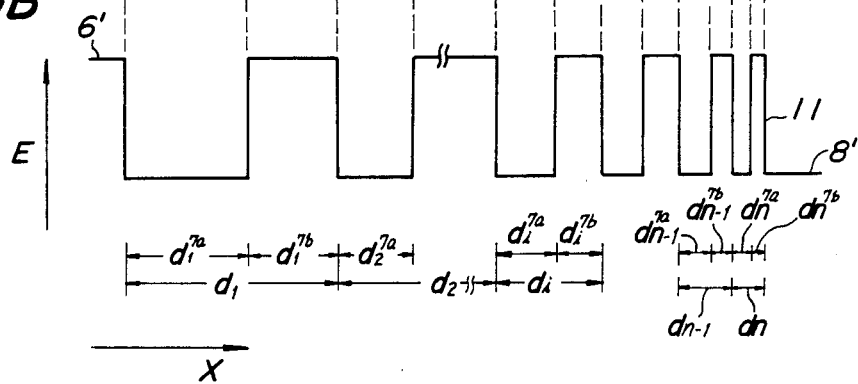
FIG. 5B is a potential diagram illustrating a potential for the structure shown in FIG. 5A.

In the semiconductor device thus constructed, a potential 11 formed in the modulated superlattice structure between the n-type homogeneous semiconductors 6 and 8 is profiled as illustrated in FIG. 5B.

At the present stage of understanding in this field, it is impossible to exactly and perfectly grasp the energy states of electrons for the potential 11. However, the miniband 2 and the minigap 3 associated with the potential 1 of the superlattice made of periodically alternating thin layers of two different semiconductors and having the same period as the ith period $d_i$ are deemed to be the minibands 12 and the minigaps 13 in the vicinity of the ith period of the modulated superlattice, respectively, as illustrated in FIG. 5C. In FIG. 5C, the miniband 12 and the minigap 13 show the first to third minibands and the first to third minigaps, respectively, when those are considered to be analogous to those of the periodical superlattice in a local sense. No minibands and minigaps in further higher energy state are illustrated for the simplicity of illustration.

Figure 6A:
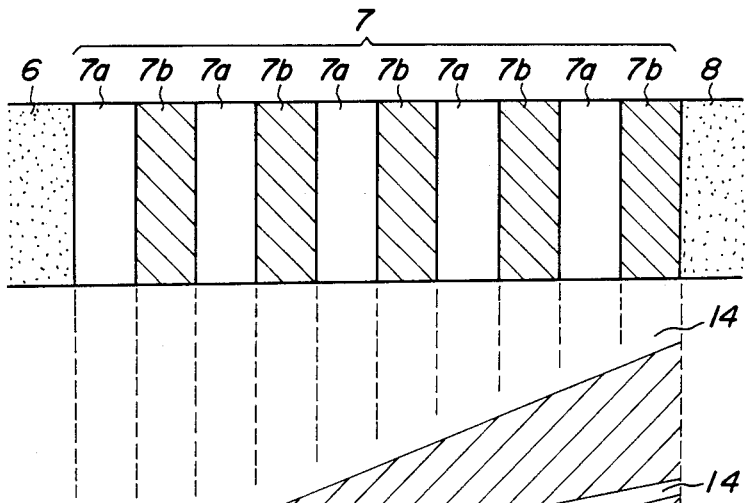
FIG. 6A is an enlarged schematic diagram showing an embodiment of a semiconductor device according to the present invention having a CHIRP superlattice structure with an amplitude modulated potential.

FIG. 6A shows a modification of the semiconductor device shown in FIG. 4, in which a composition of the semiconductor 7 with a CHIRP superlattice structure is modulated. In the figure, only five pairs of CHIRP superlattice semiconductor layers 7a and 7b are illustrated for the ease of illustration, but the number of the pairs of the semiconductor thin layer may be increased according to a negative resistance design. While maintaining the layer thicknesses of the pair of the semiconductor thin layers 7a and 7b, the band edge energy of the layer 7b may gradually be increased with respect to the band edge energy of the layer 7a, so that a potential profile 16 as illustrated in FIG. 6B is obtained.

Figure 6B:
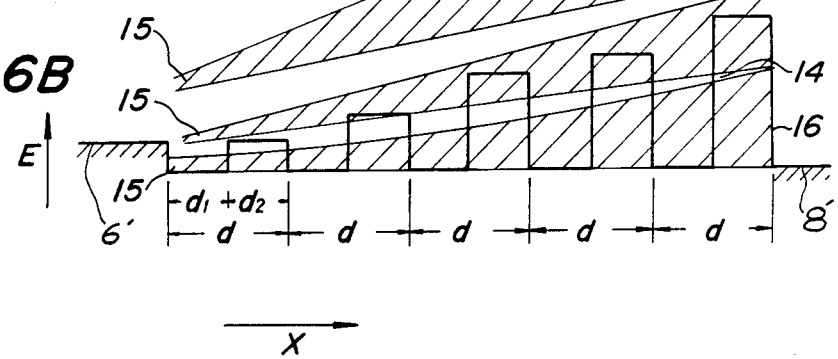
FIG. 6B is a potential and energy diagram illustrating a potential, minibands and minigaps formed by the structure shown in FIG. 6A.

In FIG. 6B, d represents a period of the superlattice, and $d_1$ and $d_2$ the thicknesses of the semiconductor thin layers 7a and 7b, respectively.

The semiconductor layer 7a may be formed by GaAs, and the layer 7b by $Al_xGa_{1-x}As$. The potential 16 can be obtained by epitaxial growth method while gradually increasing x of $Al_xGa_{1-x}As$.

Alternatively, Ge may be used for the layer 7a and $Ge_{1-x}Si_x$ for the layer 7b. The value x of the $Ge_{1-x}Si_x$ of the layers 7b can gradually be increased toward the homogeneous n-type semiconductor 8.

The potential 16 may also be obtained by decreasing the impurity concentration in the semiconductor layer 7b, even if the layers 7a and 7b are made of a single semiconductor.

The layers 7a and 7b can be formed by the combination of semiconductors capable of forming the step differences of the band edge energy as shown in FIGS. 3A–3E.

The local minibands 14 and the local minigaps 15, as formed by the potential 16, are as illustrated in FIG. 6B. The minibands 14 and the minigaps 15 are slanted from the n-type homogeneous semiconductor 6 toward the n-type homogeneous semiconductor 8.

FIG. 7A shows another modification of the semiconductor device shown in FIG. 4, in which the thickness ratio of the semiconductor thin layers 7a and 7b of the semiconductor 7 with a CHIRP superlattice structure is modulated. In this modification, the thickness ratios of the pairs of the thin layers 7a and 7b are gradually changed, while the period d is fixed, as shown in FIG. 7A. Then, a potential 17 is profiled, as illustrated in FIG. 7B. In the figure, $d_1$–$d_9$ represent thicknesses of the layers 7b With this modulation of the thickness ratio of the semiconductor layers 7a and 7b, the minibands 18 and the minigaps 19, in a local sense, may be slanted from the n-type homogeneous semiconductor 6 toward the n-type homogeneous semiconductor 8, as shown in FIG. 7B. While in this modification, only nine pairs of the thin layers 7a and 7b are illustrated by way of example, the number of the layer pairs may of course be changed according to the negative resistance characteristic as required and an electrical circuit to which the semiconductor device is applied.

Three modulation manners of the semiconductor with a CHIRP superlattice structure have been shown in FIGS. 5A, 6A and 7A. In the first embodiment shown in FIG. 5A, only the period of the potential 11 is modulated, while fixing the thickness ratio of the semiconductor layers 7a and 7b, as shown in FIGS. 5A and 5B. In the second embodiment shown in FIG. 6A, the amplitude of the potential 16 is modulated by appropriately selecting the combination of the semiconductors, as shown in FIGS. 6A and 6B. In the third embodiment shown in FIG. 7A, the thickness ratio of the semiconductor pairs are modulated so as to gradually change the width of the potential well in the potential 17, as shown in FIGS. 7A and 7B. Additional modifications of the semiconductor 7 with a CHIRP superlattice structure based on the embodiment shown in FIG. 4 can be obtained by combining two of the above three modulation manners or combining the above three modifications in a manner that the energy width, the energy value, the slope, and so on of the minibands 18 and the minigaps 19 are selected according to a negative resistance characteristic as required and an electrical circuit to which the semiconductor device is applied.

Further, in the semiconductor thin layers 7a and 7b shown in FIGS. 5A, 6A and 7A, it is not essentially required that the spatial relation between the semiconductor thin layers 7a and 7b changes abruptly from the thin layer 7a to the thin layer 7b and vice versa. The boundary may change based on a proper function with respect to distance x, such as sin x or cos x or the like. What is most important in the present invention is to modify or change the periodicity of the superlattice of the perfectly periodically alternating type. Any type of a periodical function of the potential for a superlattice may be modulated to form a semiconductor 7 with a CHIRP superlattice structure.

FIG. 8 graphically illustrates the results of computer calculation of the minibands 2 and the minigaps 3 in the perfectly periodical superlattice shown in FIG. 1. In the graph, the abscissa represents $$\frac{\hbar^2}{2m^*}\left(\frac{\pi}{d}\right)^2$$

in the form of energy, while the ordinate indicates electron energy. The upper abscissa represents a change of the period d of the superlattice. Here, m* in $$\frac{\hbar^2}{2m^*}\left(\frac{\pi}{d}\right)^2$$

is representative of the effective mass of electron, and ℏ is representative of the value of Planck's constant divided by $2\pi$.

If it is assumed that the width of the high potential part in each period of the potential 1 is $d_1$ and the low potential part is $d_2$, $d = d_1 + d_2$. The calculation results of FIG. 8 are obtained in case of $d_1 = d_2$. The fourth and subsequent minigaps and minibands are not illustrated in FIG. 8, for the simplicity of illustration. As seen from the graph, as the period d becomes smaller, the miniband 2 becomes larger. Also when $d_1$ is not equal to $d_2$, the miniband 2 and the miniband 3 can be calculated with respect to the period d by the similar calculation method. Accordingly, the minibands 12, 14 and 18 and the minigaps 13, 15 and 19 in the CHIRP superlattice structure can be determined in a local sense. Therefore, the minibands 12, 14 and 18 and the minigaps 13, 15 and 19 in the CHIRP superlattice structure can be designed according to a negative resistance characteristic as required and an electrical circuit to which the semiconductor device is applied, by using an energy chart as shown in FIG. 8.

It is seen from the above energy chart that the miniband 2 and the minigap 3 formed by the superlattice structure are spatially slanted if the superlattice structure is appropriately modulated.

Next, explanation will be made of the behavior of the CHIRP superlattice structure when an electric field is applied to the structure by way of an example of the CHIRP superlattice structure with a periodicity modulation shown in FIG. 5A.

In FIG. 9A, reference numeral 22 designates a potential. The potential 22 can be formed in a manner described above. In FIG. 9A, the potentials 6' and 8' are made of the n-type homogeneous semiconductors 6 and 8 shown in FIG. 4. Here, $d_1$–$d_{10}$ indicate modulated periods and may be designed to be $d_1 > d_2 > \cdots > d_{10}$. As for electrons, electrons in the n-type homogeous semiconductor 6 is typically represented by e on the potential 6'. The periods $d_1$ to $d_{10}$ of the potential 22 may be so chosen that the first and second minigaps 20 and the first and second minibands 21 are tilted from the potential 6' toward the potential 8'.

Electron densities of the n-type homogeneous semiconductors 6 and 8 may be chosen so that their potentials 6' and 8' are not tilted when a voltage $V_1$ is applied across the electrodes 5 and 9 in FIG. 4, as shown in FIG. 9B.

Therefore, most of the voltage $V_1$ is applied to the CHIRP superlattice structure, and accordingly, the potential of the CHIRP superlattice is tilted, as shown in FIG. 9B. At this time, the minibands 21 and the minigaps 20 are simultaneously tilted. The electron e on the potential 6' can tunnel through the lower edge of the second minigap 20 to reach the electrode 9, i.e. the potential 8'. This means that a current flows between the electrodes 5 and 9.

When the voltage is further increased up to $V_2$, the electron e can view the second minigap 20 over the entire space of CHIRP superlattice structure as shown in FIG. 9C. At this time, the electron e cannot exist in the second minigap 20. The electron e, which is to emanate from the electrode 5, is reflected by the minigap 20 to return to the electrode 5. As a result, no current flows between the electrodes 5 and 9.

When a further increased voltage $V_3$ is applied across the electrodes 5 and 9, as shown in FIG. 9D, the electron e tunnels through the upper edge of the second minigap 20 to reach the electrode 9.

The relationship between the current and the voltage, as described with reference to FIGS. 9A–9D, is illustrated in FIG. 10.

In FIG. 10, currents $I_1$ and $I_3$ flow when voltages $V_1$ and $V_3$ are applied across the electrodes 5 and 9, whereas no current flows when the voltage $V_2$ is applied across the electrodes 5 and 9. If the polarity of the applied voltage is reversed, electron e emanates from the electrode 9 instead of the electrode 5, and most of the thus emanating electrons are reflected by the first minigap 20, so that a current hardly flows. Thus, a voltage-current characteristic when the voltage is applied across the electrodes 5 and 9 of the semiconductor device shown in FIG. 4 may be determined to follow curves 23 and 24 in FIG. 10.

Further, a negative resistance can be observed in the voltage range between $V_1$ and $V_2$. A curve profile of the lower voltage portion in the curve 23 and the curve 24 shows that the semiconductor device shown in FIG. 4 has rectification characteristics.

To confirm the prediction of FIG. 10, computer simulation was carried out by solving the Schroedinger equation with respect to an electron e in the potential 22 in FIG. 9. The result of the computer simulation is shown in FIG. 11.

In FIG. 11, the abscissa represents an electric field in the CHIRP superlattice. A corresponding voltage can be obtained by multiplying the electric field by the length of the CHIRP superlattice structure, i.e., $(d_1 + d_2 + \cdots + d_{10})$ in FIG. 9. The ordinate represents a transmissivity of an electron e, which emanates from the potential 6', passes through the CHIRP superlattice structure to reach the potential 8'. In the computer simulation, the ith period $d_i$ of the CHIRP superlattice structure was expressed by the following equation. Here, a thickness ratio $d_i°/d_i$ of the semiconductor thin layers was $\frac{1}{2}$.

$$\frac{\hbar^2}{2m^*}\left(\frac{\pi}{d_i}\right)^2 = \tfrac{1}{2}V_0 + qE_d x_i \tag{1}$$

where m* is the effective electron mass, ℏ is the value of Planck's constant divided by $2\pi$, $V_0$ the height of the potential shown in FIG. 9, q the elementary charge, $E_d$ the intensity of electric field, and $x_i$ the distance from the potential $6'$ to the ith period $d_i$.

As seen from FIG. 11, the electron transmissivity is zero when the electric field is $E_d$, and under this condition the electrons are perfectly reflected. The curve 25 in FIG. 11 can be converted to the curve 23 in FIG. 10, if the electron transmissivity is multiplied by the current flowing between the potentials $6'$ and $8'$ in FIG. 9 in accordance with Ohm's law.

If the thickness ratio $d_1^i/d_1$ in FIG. 9A, is not a specific value like $\frac{1}{2}$, but an arbitrary value $\alpha$, equation (1) can be replaced by the following equation (2).

$$\frac{\hbar^2}{2m^*}\left(\frac{\pi}{d_i}\right)^2 = \alpha V_0 + qE_d x_i \quad (2)$$

In this case, a transmissivity curve of an electron e similar to the curve 25 in FIG. 11 can be obtained. Other suitable methods than those of the equations (1) and (2) are also available for formation of the potential 22.

Figure 12:
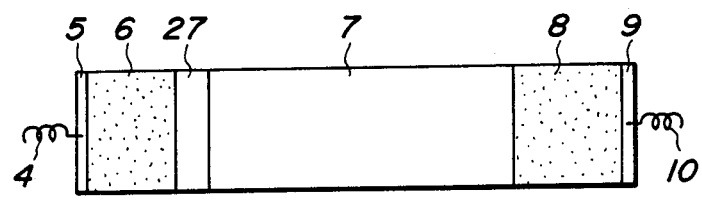
FIG. 12 is a schematic diagram showing an embodiment of a semiconductor device according to the present invention in which a low carrier concentration semiconductor layer is arranged between the homogeneous semiconductor and the semiconductor with a CHIRP superlattice structure.

Reference is now made to FIG. 12 schematically illustrating a semiconductor device in which a low carrier concentration semiconductor layer is disposed adjacent to a modulated superlattice structure, i.e. a semiconductor with a CHIRP superlattice structure. In FIG. 12, the same reference numerals are used to designate like or equivalent portions in FIG. 4. In the figure, reference numeral 27 designates a low carrier concentration semiconductor layer provided between the n-type homogeneous semiconductor 6 and the semiconductor 7 with a CHIRP superlattice structure.

Figure 13:
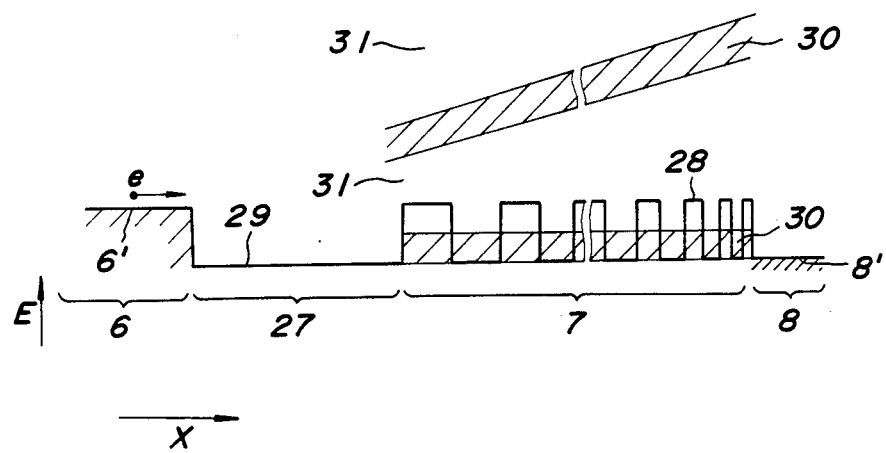
FIG. 13 is a potential and energy diagram illustrating a potential, minibands and minigaps as given by the structure shown in FIG. 12.

FIG. 13 illustrates a potential diagram formed by the semiconductor device shown in FIG. 12. The potential may be formed as shown by a potential 29 by the uniform semiconductor 27. While in the semiconductor device, the semiconductor 7 with a CHIRP superlattice structure has a gradually changing or modulating periodicity as indicated by the potential 28, it is evident that the amplitude modulation as shown in FIG. 6A, the thickness ratio modulation as shown in FIG. 7A or the combination thereof is also applicable for this semiconductor device.

The potential $6'$ may be formed by the n-type homogeneous semiconductor 6; the potential 29 by the uniform semiconductor 27; the potential 28 by the semiconductor 7 with a CHIRP superlattice structure; and the potential $8'$ by the n-type homogeneous semiconductor 8. Further, the minigap 30 and the miniband 31 may be formed by the potential 28. An electron e, which is emitted from the n-type homogeneous semiconductor 6 to the low carrier concentration semiconductor of the potential 29, can pass through the miniband 31 without being reflected at the edge of the second minigap 30, when a low voltage is applied across the electrodes 5 and 9. Further, even when the applied voltage is larger than that providing the perfect reflection of electrons, the low carrier concentration semiconductor may be tilted to lower the second minigap in terms of energy of the CHIRP superlattice adjacent to the low carrier concentration semiconductor. Therefore, the electrons e can enter the miniband 31 without being reflected at the edge of the second minigap 30. Therefore, the electron transmissivity is increased considerably and the negative resistance characteristic is greatly improved as well. A computer simulation was performed to obtain the transmissivity in this semiconductor device, and its result is indicated by the curve 26 in FIG. 11. This curve 26 shows that the transmissivity is greatly improved in comparison to the curve 25.

N-type homogeneous semiconductors 6 and 8 and the semiconductor 7 with a CHIRP superlattice structure may form the potentials $6'$, 34 and $8'$ schematically illustrated in FIG. 14. The miniband 33 and the minigap 32 may be formed by the potential 34. Here, it is assumed that $W_1$ is the energy from the potential $8'$ to the upper edge u of the first minigap 32 and $W_2$ is the energy from the potential $8'$ to the lower edge 1 of the second minigap 32. It is also assumed that $W_c$ is the energy of the potential $6'$.

In FIG. 14, when a voltage V applied across the n-type homogeneous semiconductors 6 and 8 is increased, the first minigap 32 prohibits the passage of the electrons e from the n-type homogeneous semiconductor 6 through the semiconductor 7, until the upper edge u of the minigap 32 has the same energy as the potential $6'$. When the energy at the point u is decreased below the potential $6'$ by the increased voltage V, the electrons e can pass through the first miniband 33, i.e., the electrons e can pass through the semiconductor 7 with a CHIRP superlattice structure. When the voltage V is further increased and the energy at the point 1 approximates to the potential $6'$, the electrons e must pass through the second minigap 32. As a result, the transmissivity is decreased.

These behaviors are depicted as a curve 35 in FIG. 15A. In the figure, the abscissa represents voltage, while the ordinate represents transmissivity.

In FIG. 15B, a curve 36 illustrates a current-voltage characteristic corresponding to the transmissivity variation illustrated in FIG. 15A. In the graph, reference numeral 37 indicates a leakage current, 38 indicates a current flowing according to Ohm's law, and 39 a current flow when the polarity of the applied voltage is reversed. The curves 36 and 39 also indicate a rectifying function. FIG. 15B illustrates a negative resistance which is different from that of FIG. 10.

If the low carrier concentration semiconductor layer 27 shown in FIG. 12 is provided between the n-type homogeneous semiconductor 6 and the semiconductor 7 with the CHIRP superlattice structure having a characteristic illustrated in FIG. 14, the current-voltage characteristic shown in FIG. 15B can be improved.

To obtain the negative resistance characteristic as illustrated in FIG. 10 or FIG. 15B in the semiconductor device with a CHIRP superlattice structure, it is essential that the minibands and the minigaps, which are produced by the potentials 22 and 34 of the CHIRP superlattice structure are slanted along the distance x in terms of energy. The potential 22 and the potential 34 of the CHIRP superlattice structure may be formed by modulating the period, the amplitude, the thickness ratio, or any combination thereof.

According to the present invention, a semiconductor device with negative resistance characteristic is formed by the combination of semiconductors with any desired potential in a manner that the height of the potential formed by the homogeneous semiconductor 6, the height of the potential formed by the low carrier concentration semiconductor 27, the forms of the minibands and the minigaps formed by the semiconductor with the CHIRP superlattice structure 7, and the height of the potential formed by the n-type semiconductor 8 are appropriately chosen. Therefore, a semiconductor device with any desired negative resistance can be designed and manufactured in accordance with a desired electric circuit such as switching circuit, oscillator, amplifier, detector, frequency converter and so on.

Alternatively, a plurality of the semiconductor devices with a CHIRP superlattice structure can be appropriately combined, with one of them being used for electron anti-reflection introductory portion. In this case, a current-voltage characteristic of the other CHIRP superlattice is greatly improved. Embodiments of this type will be discussed in detail.

FIG. 16A shows this type of embodiment of a semiconductor device according to the present invention in which a CHIRP superlattice semiconductor 41 of the type shown in FIG. 6A is disposed adjacent to the CHIRP superlattice semiconductor 7 of the type shown in FIG. 5A. The design parameters in both the end portions of the CHIRP superlattice semiconductor 41 are chosen to be substantially equal to or to be close to those of the homogeneous semiconductor 6 and the CHIRP superlattice semiconductor 7, so that the CHIRP superlattice semiconductor 41 has a potential distributed as illustrated in FIG. 16C.

More specifically, as shown in FIGS. 16B and 16C, the step difference of band edge energy and the thicknesses of each pair of semiconductor layers 41a and 41b, and the thickness ratio thereof during each one period in the end portion of the CHIRP superlattice semiconductor 41, which is adjacent to the CHIRP superlattice semiconductor 7, are made substantially equal to or close to those of the CHIRP superlattice semiconductor 7. On the other hand, the step difference of the band edge energy of each pair of the layers 41a and 41b in the end portion of the CHIRP superlattice semiconductor 41 adjacent to the n-type homogeneous semiconductor 6 is decreased to have the band edge energy approximate to the band edge energy 6' of the homogeneous semiconductor 6. The step difference of the band edge energy in the CHIRP superlattice semiconductor 41 is so distributed to gradually change to approximate to those of the homogeneous semiconductor 6 and the CHIRP superlattice semiconductor 7 on both sides of the semiconductor 41.

An electric field required to produce a nonlinear current-voltage characteristic in the CHIRP superlattice semiconductor 41 may be chosen to be higher than that for the CHIRP superlattice semiconductor 7. Therefore, this semiconductor device may be designed so that the CHIRP superlattice semiconductor 7 dominantly produces the non-linear characteristic of the semiconductor device.

It is considered that, in this combined type of the CHIRP superlattice, minibands 44 and minigaps 45 are formed by the potential distribution as illustrated in FIG. 16C. Therefore, the discontinuity in the miniband structure between the CHIRP superlattice semiconductor 7 and the homogeneous semiconductor 6 is removed, and accordingly the quantum mechanical electron reflection at the interface between the semiconductors 7 and 6 is remarkably reduced. As a result, the difference between the current which flows when the semiconductor device is conductive and the current which flows when it is in a negative resistance is increased. In this embodiment, the CHIRP superlattice semiconductor 41 serves as an anti-reflection portion from a viewpoint of quantum phenomenon.

While in this embodiment, only the seven layers 41a and 41b are illustrated for the CHIRP superlattice semiconductor 41 as an anti-reflection portion, for the simplicity of illustration, any number of the layers such as more than seven layers or one or two layers may be used according to required electrical characteristics for an anti-reflection portion.

Another embodiment of a semiconductor device with another type of anti-reflection portion which is made of a graded semiconductor 51 with a gradually changing composition and of a CHIRP superlattice semiconductor 52 composed of plural pairs of semiconductor layers 52a and 52b and having gradually changing step differences of band edge energy is shown schematically in FIG. 17A and FIG. 17B. Both the semiconductors 51 and 52 are substituted for the CHIRP superlattice semiconductor 41 in FIG. 16A and are sandwiched between the CHIRP superlattice semiconductor 7 and the n-type homogeneous semiconductor 6. The graded semiconductor 51 is so provided as to have the band edge energy corresponding to the band edge energy 6' of the homogeneous semiconductor at the interface with the adjacent homogeneous semiconductor 6, and to the band edge energy of the lower edge of the first miniband 56 of the CHIRP superlattice semiconductor 52 at the interface with the CHIRP superlattice semiconductor 52. Therefore, a potential distribution of the graded semiconductor 51 has a slope 55 as illustrated in FIG. 17C.

The CHIRP superlattice semiconductor 52 is so designed on both sides thereof as to have design parameters corresponding to those of the graded semiconductor 51 and the CHIRP superlattice semiconductor 7. More specifically, as shown in FIGS. 17B and 17C, the step difference of band edge energy and the thickness of each pair of the semiconductor layers 52a and 52b, and the thickness ratio during each one period in the end portion of the CHIRP superlattice semiconductor 52 which is adjacent to the CHIRP superlattice semiconductor 7, are made substantially equal to or close to those of the CHIRP superlattice semiconductor 7. On the other hand, the step difference of the band edge energy of each pair of the layers 52a and 52b in the end portion of the CHIRP superlattice, which is adjacent to the graded semiconductor 51, is so decreased to have the band edge energy corresponding to the band edge energy 55 of the graded semiconductor 51. The semiconductor device thus arranged have effects similar to those of the semiconductor device shown in FIGS. 16A and 16B. The combination of the graded semiconductor 51 and the CHIRP superlattice semiconductor 52 constitute an anti-reflection portion from a viewpoint of quantum phenomenon.

The potential distribution in this embodiment provides, as illustrated in FIG. 17C, a miniband 56 and a minigap 57 extending from the graded potential portion 55 to the superlattice semiconductor 7.

Alternatively, the superlattice semiconductor 41 shown in FIGS. 16A may be replaced by a superlattice semiconductor modulated in the manner explained with reference to FIGS. 7A and 7B. This modification will be explained with reference to FIGS. 18A and 18B, which respectively illustrate its scheme and a potential distributed by the scheme. In FIG. 18A, reference numeral 61 denotes a CHIRP superlattice semiconductor modulated in the manner explained with reference to FIGS. 7A and 7B. The semiconductor with the CHIRP superlattice structure 61 has pairs of layers 61a and 61b. A potential 62 as illustrated in FIG. 18B is formed by changing the thickness ratio between the layers 61a and 61b. In FIG. 18B, reference numeral 63 designates minibands, and 64 minigaps.

When the semiconductor with the CHIRP superlattice structure 7 of FIG. 7A is used to form the anti-reflection portion, it is necessary to satisfy the interface condition thereof with the adjacent homogeneous semiconductor 6. That is, the thickness ratio of the CHIRP superlattice of the anti-reflection portion at the end portion during one period must be designed in a manner that the film having the same band edge energy as that of the homogeneous semiconductor is sufficiently larger than that of the film having the band edge energy different from that of the adjacent homogeneous semiconductor.

Figure 19:
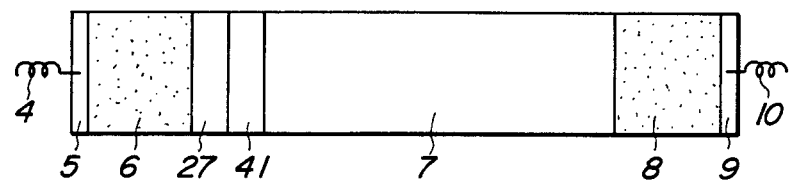
FIG. 19 is a schematic diagram showing a structure of a modification of the semiconductor device shown in FIG. 12 in which the CHIRP superlattice for anti-reflection portion used in FIG. 16 is additionally used for the anti-reflection portion.
Figure 20:
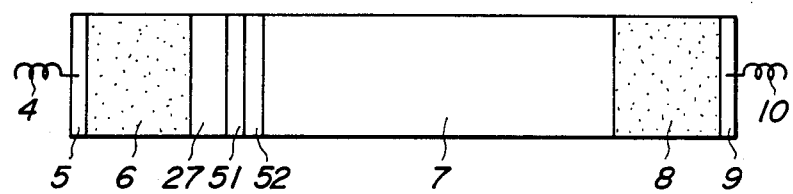
FIG. 20 is a schematic diagram showing a structure of a modification of the semiconductor device shown in FIG. 12 in which the combination of the anti-reflection portion semiconductors shown in FIG. 17 is additionally used for the anti-reflection portion.

Referring now to FIGS. 19 and 20, there are schematically illustrated two further embodiments of a semiconductor device according to the present invention, each of which corresponds to semiconductor device shown in FIG. 12 with an additional provision of an anti-reflection portion structured as mentioned above. The embodiment shown in FIG. 19 uses the CHIRP superlattice semiconductor 41 for the anti-reflection portion. The embodiment shown in FIG. 20 uses the graded semiconductor 51 and the CHIRP superlattice semiconductor 52 for the anti-reflection portion.

A current difference due to the negative resistance can be increased by the CHIRP superlattice semiconductor 41 or the combination of the graded semiconductor 51 and the CHIRP superlattice semiconductor 52 arranged between the homogenenous semiconductor 27 and the CHIRP superlattice semiconductor 7. In those embodiments, it is to be noted that those semiconductors 41, 51 and 52 are designed so as to satisfy the interface conditions with the homogeneous semiconductor 27 and the CHIRP superlattice semiconductor 7.

Also in the complicated type CHIRP superlattice structures with the anti-reflection portions, as shown in FIGS. 19 and 29, the CHIRP superlattice structure shown in FIG. 6 or 7 may be used for the CHIRP superlattice semiconductor 7. Further, the CHIRP superlattice semiconductor 41 or 52 as the anti-reflection portion may be replaced by the CHIRP superlattice structure shown in FIG. 5 or FIG. 7.

To confirm the advantageous effects of the anti-reflection portion, a computer simulation was performed by solving the Schroedinger equation for the electrons. The results of the computer simulation are shown in FIGS. 21A to 21C. In the figures, diagrams on the left side in FIGS. 21A-21C illustrate potentials, miniband and minigaps of the superlattice, while on the right side, reflectivities of electrons when they are injected into the superlattice potential from the left side are plotted with respect to electron energy.

As seen from FIG. 21A, when electrons are injected into the perfect periodic superlattice from the left side, the quantum mechanical reflection allows only 50% of the injected electrons to penetrate into the first miniband. However, when the potential of the CHIRP superlattice is used as the anti-reflection portion, the reflection at the first miniband is substantially reduced to zero, and hence most of the injected electrons can penetrate therethrough from a viewpoint of quantum phenomenon, as shown in FIGS. 21B and 21C.

Thus, the simulation showed that the anti-reflection portion of the CHIRP superlattice is very effective in order to enhance the penetration of electrons and can enlarge the current difference in the current-voltage characteristics. This results in a large improvement of injection efficiency.

What is claimed is:

1. A semiconductor device comprising
    a superlattice semiconductor portion having first and second ends and including a plurality of laminated pairs of semiconductor thin films arranged along an axis perpendicular to the interface thereof thereby forming a potential profile along said axis determined by the stepped differences between the band edge energies of the thin films forming each of said pairs, said potential profile having virtual miniband and minigap energy states associated therewith and being defined by at least one of the thickness, chemical composition and dopant materials of said thin films, at least one of the thickness, chemical composition and dopant materials of said thin films being modulated in the direction of said axis whereby said miniband and minigap energy states are monotonically changed in the direction of said axis for every pair of said thin films; and
    electrodes coupled to the first and second ends of said superlattice semiconductor portion for applying an electric field thereacross.

2. A semiconductor device according to claim 1, wherein the thickness of each pair of said semiconductor thin films changes at the interfaces thereof.

3. A semiconductor device according to claim 1, wherein the chemical compositions of said pairs of semiconductor thin films vary sequentially along said axis, the potential height of one pair being different in said axial direction from the potential height of an adjacent pair.

4. A semiconducotr device according to claim 1, wherein the ratios of the thicknesses of the thin films in sequentially disposed pairs are varied along said axis.

5. A semiconductor device according to claim 2, wherein the ratios of the thicknesses of the thin films in said sequentially disposed pairs are varied along said axis.

6. A semiconductor device according to claim 3, wherein the ratios of the thicknesses of the thin films in said sequentially disposed pairs are varied along said axis.

7. A semiconductor device according to claim 1, wherein a homogeneous semiconductor layer is interposed between said superlattice semiconductor portion and at least one of said electrodes.

8. A semiconductor device according to claim 7, wherein the thickness of each pair of said semiconductor thin films changes at the interfaces thereof.

9. A semiconductor device according to claim 7, wherein the chemical compositions of said pairs of semiconductor thin films vary sequentially along said axis, the potential height of one pair being different in said axial direction from the potential height of an adjacent pair.

10. A semiconductor device according to claim 7, wherein the ratios of the thicknesses of the thin films in said sequentially disposed pairs are varied along said axis.

11. A semiconductor device according to claim 7, wherein a low carrier concentration semiconductor layer, the carrier concentration of which is lower than that of said homogeneous semiconductor layer, is interposed between said homogeneous semiconductor layer and said superlattice semiconductor portion.

12. A semiconductor device according to claim 11, wherein the thickness of each pair of said semiconductor thin films changes at the semiconductor interfaces thereof.

13. A semiconductor device according to claim 11, wherein the chemical compositions of said pairs of semiconductor thin films vary sequentially along said axis, the potential height of one pair being different in said axial direction from the potential height of an adjacent pair.

14. A semiconductor device according to claim 11, wherein the ratios of the thicknesses of the thin films in said sequentially disposed pairs are varied along said axis.

15. A semiconductor device comprising
a superlattice semiconductor portion having first and second ends including a plurality of laminated pairs of semiconductor thin films arranged along an axis perpendicular to the interfaces thereof forming a potential profile along said axis determined by the stepped differences between the band edge energies of the thin films forming each of said pairs, said potential profile having virtual miniband and minigap energy states associated therewith and being defined by at least one of the thickness, chemical composition and dopant materials of said thin films, at least one of the thickness, chemical composition and dopant materials of said thin films being modulated in the direction of said axis whereby said miniband and minigap energy states are monotonically changed in the direction of said axis for every pair of said thin films;
electrodes coupled to the first and second ends of said superlattice semiconductor portion for applying an electric field thereacross; and
an anti-reflection portion interposed between said superlattice semiconductor portion and at least one of said electrodes, one end portion of said anti-reflection portion in the vicinity of said superlattice semiconductor portion having a potential profile which is similar to the potential profile formed by said superlattice semiconductor portion, the other end of said anti-reflection portion having a uniform potential profile and the middle region between said one end and the other end of said anti-reflection portion having a potential profile which resides in the middle of said potential profiles in the end portions of said anti-reflection portion.

16. A semiconductor device according to claim 7, wherein an anti-reflection portion is disposed adjacent to said superlattice semiconductor portion, and said homogeneous semiconductor layer is interposed between said anti-reflection portion and one of said electrodes.

17. A semiconductor device according to claim 7, wherein an anti-reflection portion is interposed between said homogeneous semiconductor layer and one of said electrodes.

18. A semiconductor device according to claim 15, wherein said anti-reflection portion is formed by a superlattice semiconductor including a plurality of laminated pairs of semiconductor thin films arranged along an axis perpendicular to the interfaces thereof and forming a potential profile along said axis determined by the stepped differences between the band edge energies of the thin films forming each of said pairs, said potential profile having virtual miniband and minigap energy states associated therewith and being defined by at least one of the thickness, chemical composition and dopant materials of said thin films, at least one of the thickness, chamical composition and dopant materials of said thin films being modulated in the direction of said axis whereby said miniband and minigap energy states are monotonically changed in the direction of said axis for every pair of said thin films.

19. A semiconductor device according to claim 18, wherein the thickness of each pair of said semiconductor thin films changes at the semiconductor interfaces thereof.

20. A semiconductor device according to claim 18, wherein the chemical compositions of said pairs of semiconductor thin films vary sequentially along said axis, the potential height of one pair being different in said axial direction from the potential height of an adjacent pair.

21. A semiconductor device according to claim 18, wherein the ratios of the thicknesses of the thin films in said sequentially disposed pairs vary along said axis.

22. A semiconductor device according to claim 19, wherein the ratios of the thicknesses of the thin films in said sequentially disposed pairs vary along said axis.

23. A semiconductor device according to claim 20, wherein the ratios of the thicknesses of the thin films in said sequentially disposed pairs vary along said axis.

24. A semiconductor device according to claim 18, wherein said superlattice semiconductor portion is formed by a pair of different semiconductor thin films.

25. A semiconductor device according to claim 16, wherein said anti-reflection portion includes a semiconductor portion which is disposed adjacent to said homogeneous semiconductor layer, the composition of said semiconductor portion changing continuously.

26. A semiconductor device according to claim 25, wherein said composition of said semiconductor portion gradually changes in a graded manner.

* * * * *